US010720420B2

(12) United States Patent
ChenHsu et al.

(10) Patent No.: US 10,720,420 B2
(45) Date of Patent: Jul. 21, 2020

(54) ELECTROSTATIC DISCHARGE PROTECTION DEVICE

(71) Applicant: uPI Semiconductor Corp., Hsinchu County (TW)

(72) Inventors: Ming-Chun ChenHsu, Hsinchu County (TW); Chih-Hao Chen, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 16/180,032

(22) Filed: Nov. 5, 2018

(65) Prior Publication Data
US 2019/0371786 A1    Dec. 5, 2019

(30) Foreign Application Priority Data
Jun. 5, 2018    (TW) .............................. 107119394 A (51) Int. Cl.
*H01L 27/02* (2006.01)
*H01L 29/861* (2006.01)
(Continued)

(52) U.S. Cl.
CPC ...... *H01L 27/0255* (2013.01); *H01L 27/0814* (2013.01); *H01L 29/0649* (2013.01); *H01L 29/861* (2013.01); *H05K 1/0259* (2013.01)

(58) Field of Classification Search
CPC ........... H01L 23/5283; H01L 21/76897; H01L 21/28562; H01L 23/485; H01L 21/76885; H01L 21/76805; H01L 21/76816; H01L 21/76843; H01L 21/76895; H01L 23/53266; H01L 23/535; H01L 23/5329; H01L 23/53242; H01L 23/53228; H01L 23/53214; H01L 23/53257; H01L 27/0255; H01L 27/0259–0262
See application file for complete search history.

(56) References Cited

U.S. PATENT DOCUMENTS 8,431,999 B2    4/2013    Shen et al.
10,043,790 B2    8/2018    Chen
(Continued)

FOREIGN PATENT DOCUMENTS

CN    204348721    5/2015
TW    201322424    6/2013

*Primary Examiner* — Cuong B Nguyen
(74) *Attorney, Agent, or Firm* — JCIPRNET (57) ABSTRACT

Provided is an electrostatic discharge protection device including a first work area and a second work area. The first work area is configured to form a face-to-face connected diode string. The first work area includes a plurality of first sub-work areas. Each of the first sub-work areas includes a first doped region of a first conductivity type disposed in a substrate, a second doped region of a second conductivity type disposed in the substrate and surrounding the first doped region, and a third doped region of the second conductivity type disposed below the second doped region. The second work area is configured to form at least one diode. The second work area includes at least one second sub-work area. The second sub-work area includes a fourth doped region of the second conductivity type disposed in the substrate. Besides, the fourth doped region is electrically connected to the first doped region.

15 Claims, 5 Drawing Sheets

(51) Int. Cl.
*H01L 27/08* (2006.01)
*H05K 1/02* (2006.01)
*H01L 29/06* (2006.01)

(56) References Cited

U.S. PATENT DOCUMENTS

2004/0239242 A1* 12/2004 Mano .................... F21V 5/04
    313/512
2013/0285091 A1* 10/2013 Akimoto ................ H01L 33/44
    257/98
2014/0363930 A1   12/2014 Bobde

* cited by examiner

ELECTROSTATIC DISCHARGE PROTECTION DEVICE

CROSS-REFERENCE TO RELATED APPLICATION

This application claims the priority benefit of Taiwan application serial no. 107119394, filed on Jun. 5, 2018. The entirety of the above-mentioned patent application is hereby incorporated by reference herein and made a part of this specification.

BACKGROUND OF THE INVENTION

Field of Invention

The present invention relates to a semiconductor device, and more generally to an electrostatic discharge protection device having an electrostatic discharge protection function.

Description of Related Art

Electrostatic discharge (ESD) is a significant factor causing damage to circuit components used in high-speed transmission interfaces. In order to avoid damage from electrostatic discharge, an electrostatic discharge protection device must be placed between the input and output terminals. However, as the applications of electronic devices are developed, data is required to transmit faster and faster at the transmission interfaces. Any impedance mismatch or discontinuity will increase the system's noise and jitter. Therefore, the electrostatic discharge protection device between the input and output terminals is required to form with good electrostatic discharge protection capability as well as low parasitic capacitance, for ensuring the quality and signal integrity of a high-speed signal and therefore the effective protection of a circuit component.

The traditional transient voltage suppressor (TVS) utilizes two back-to-back connected diode structures (i.e., connected capacitors in series) to generate small parasitic capacitance. The electrostatic discharge protection capability of the TVS is determined by the junction area of a reverse biased diode. Therefore, if the junction area of the reverse biased diode is too small, the TVS will not be able to withstand high power impact. On the other hand, if the junction area of the reverse biased diode in the TVS is increased, the parasitic capacitance is increased and the performance of the protected component itself is degraded. This is unacceptable for the circuit components used in high-speed transmission interfaces.

SUMMARY OF THE INVENTION

Accordingly, the present invention provides an electrostatic discharge protection device formed with low capacitance and high electrostatic discharge protection capability through the existing processes.

The present invention provides an electrostatic discharge protection device including a first module. The first module includes a first work area, a first isolation structure of a first conductivity type and a second work area. The first work area is configured to form a face-to-face connected diode string. The first work area includes a plurality of first sub-work areas. Each of the first sub-work areas includes a first doped region of the first conductivity type disposed in a substrate, a second doped region of a second conductivity type disposed in the substrate and surrounding the first doped region, and a third doped region of the second conductivity type disposed below the second doped region. The first isolation structure is disposed in the substrate and located between the first sub-work areas. The second work area is configured to form at least one diode. The second work area includes at least one second sub-work area. The second sub-work area includes a fourth doped region of the second conductivity type disposed in the substrate. Besides, the fourth doped region is electrically connected to the first doped region.

According to an embodiment of the present invention, the electrostatic discharge protection device further includes a plurality of second isolation structures of the first conductivity type disposed between and outside of the first work area and the second work area.

According to an embodiment of the present invention, a doping concentration of the third doped region is higher than a doping concentration of the second doped region.

According to an embodiment of the present invention, the first doped region and the fourth doped region are electrically connected to a positive electrode, and the substrate is electrically connected to a negative electrode.

According to an embodiment of the present invention, the electrostatic discharge protection device further includes a second module. The second module includes a third work area, a third isolation structure of the first conductivity type and a fourth work area. The third work area is configured to form a face-to-face connected diode string and having a plurality of third sub-work areas. Each of the third sub-work areas comprises a fifth doped region of the first conductivity type, disposed in the substrate, a sixth doped region of the second conductivity type disposed in the substrate and surrounding the fifth doped region, and a seventh doped region of the second conductivity type disposed in the substrate and located below the sixth doped region. The third isolation structure is disposed in the substrate and located between the third sub-work areas. The fourth work area is configured to form at least one diode and having at least one fourth sub-work area. The at least one fourth sub-work area includes an eighth doped region of the second conductivity type disposed in the substrate and electrically connected to the fifth doped region.

According to an embodiment of the present invention, the first doped region and the fourth doped region electrically connected to a positive electrode, and the fifth doped region and the eighth doped region electrically connected to a negative electrode.

According to an embodiment of the present invention, the first doped region and the fourth doped region electrically connected to a negative electrode, and the fifth doped region and the eighth doped region electrically connected to a positive electrode.

According to an embodiment of the present invention, a junction area between the first doped region and the second doped region in the first work area is A1, a junction area between the fourth doped region and the substrate in the second work area is A2, a junction area between the fifth doped region and the sixth doped region in the third work area is A3, a junction area between the eighth doped region and the substrate in the fourth work area is A4, a ratio of A1/A4 is less than or equal to about ½, and a ratio of A3/A2 is less than or equal to about ½.

According to an embodiment of the present invention, the ratio of A1/A4 is between about ½ and about ⅒, and the ratio of A3/A2 is between about ½ and about ⅒.

According to an embodiment of the present invention, the electrostatic discharge protection device further includes a plurality of fourth isolation structures of the first conductivity type, disposed between and outside of the third work area and the fourth work area.

According to an embodiment of the present invention, the second work area and the fourth work area are located between the first work area and the third work area.

According to an embodiment of the present invention, the at least one second sub-work area includes a plurality of second sub-work areas, and a fifth isolation structure of the first conductivity type is disposed between the second sub-work areas.

According to an embodiment of the present invention, the at least one fourth sub-work area includes a plurality of fourth sub-work areas, and a sixth isolation structure of the first conductivity type is disposed between the fourth sub-work areas.

According to an embodiment of the present invention, the electrostatic discharge protection device further includes a first protection structure disposed between the first module and the second module. The first protection structure includes a ninth doped region of the second conductivity type, disposed in the substrate, and a tenth doped region of the first conductivity type, disposed in the substrate and surrounding the ninth doped region.

According to an embodiment of the present invention, the electrostatic discharge protection device further includes a second protection structure disposed outside of the first module and the second module and includes an eleventh doped region of the second conductivity type, disposed in the substrate.

According to an embodiment of the present invention, the first protection structure and the second protection structure are electrically connected to each other.

The present invention further provides an electrostatic discharge protection device including a first work area, a second work area, a third work area and a fourth area. The first work area is configured to form a face-to-face connected diode string, and a PN junction area of the diode string is A1. The second work area is configured to form a diode, and a PN junction area of the diode is A2. The third work area is configured to form a face-to-face connected diode string, and a PN junction area of the diode string is A3. The fourth work area is configured to form a diode, and a PN junction area of the diode is A4. Besides, a ratio of A1/A4 is less than or equal to about ½, and a ratio of A3/A2 is less than or equal to about ½.

According to an embodiment of the present invention, the ratio of A1/A4 is between about ½ and about ⅒, and the ratio of A3/A2 is between about ½ and about ⅒.

In view of the above, the present invention provides a bidirectional transient voltage suppressor with low capacitance characteristics. The parasitic capacitance of the bidirectional transient voltage suppressor can be reduced and the electrostatic discharge protection capability of the same can be enhanced by dividing the work area to reduce the PN junction area, adjusting the area ratio between the divided work areas and/or disposing an isolation protection structure between devices.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In below embodiments in which the first conductivity type is a P-type and the second conductivity type is an N-type are provided for illustration purposes, and are not construed as limiting the present invention. In another embodiment, the first conductivity type can be an N-type, and the second conductivity type can be a P-type.

Figure 1A:
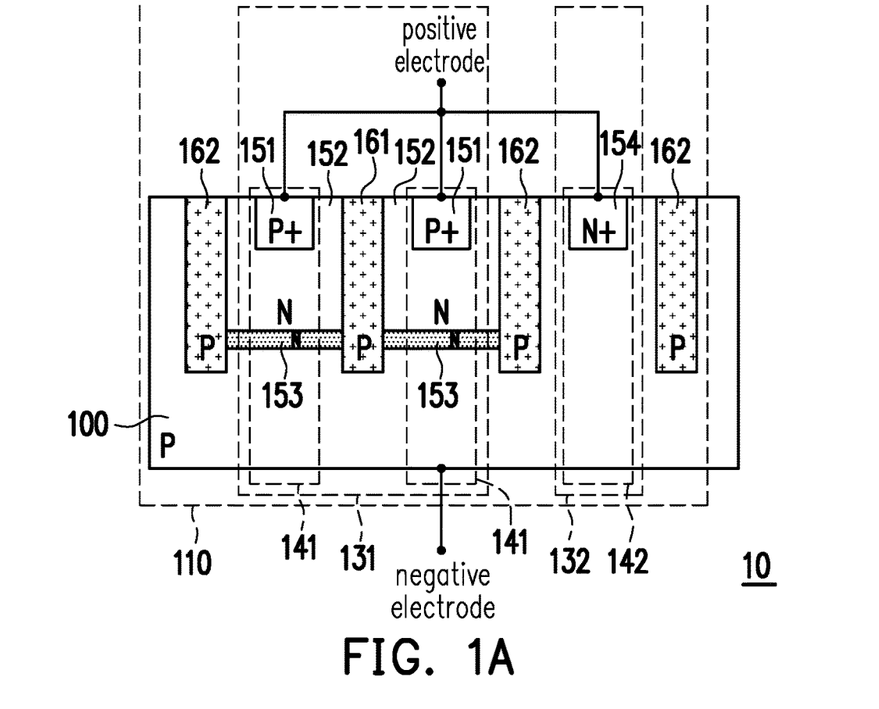
FIG. 1A illustrates a schematic cross-sectional view of an electrostatic discharge protection device according to an embodiment of the present invention.
Figure 1B:
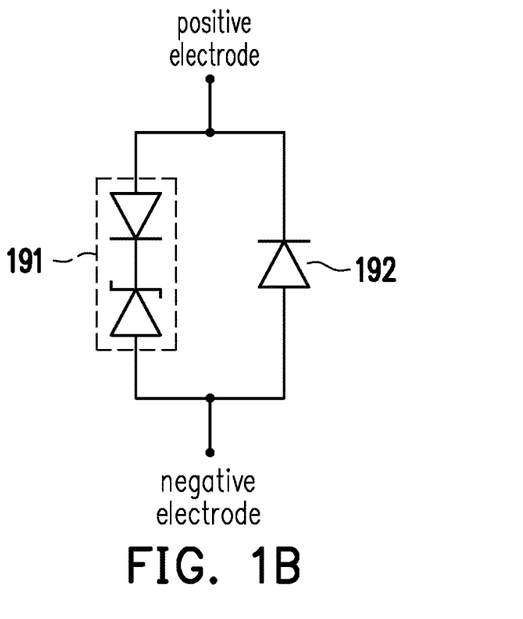
FIG. 1B illustrates an equivalent circuit diagram of an electrostatic discharge protection device according to an embodiment of the present invention.

FIG. 1A illustrates a schematic cross-sectional view of an electrostatic discharge protection device according to an embodiment of the present invention. FIG. 1B illustrates an equivalent circuit diagram of an electrostatic discharge protection device according to an embodiment of the present invention.

Referring to FIG. 1A, an electrostatic discharge protection device 10 includes a first module 110. The first module 110 includes a first work area 131, a second work area 132 and a first isolation structure 161 of a first conductivity type. Referring to FIG. 1B, in an equivalent circuit, the electrostatic discharge protection device 10 includes a face-to-face connected diode string 191 and at least one diode 192.

Referring to FIG. 1A and FIG. 1B, the first work area 131 is configured to form a face-to-face connected diode string 191. The first work area 131 has a plurality of first sub-work areas 141. Each of the first sub-work areas 141 includes a first doped region 151 of the first conductivity type, a second doped region 152 of a second conductivity type and a third doped region 153 of the second conductivity type. The first doped region 151 is heavily doped with a P-type dopant and disposed in a substrate 100 of the first conductivity type. The second doped region 152 is doped with an N-type dopant (labelled as N or N−) and disposed in the substrate 100 and surrounds the first doped region 151. In an embodiment, the second doped region 152 is an N-type body layer (abbreviated as N body). The third doped region 153 is disposed in the substrate 100 and located below the second doped region 152. In an embodiment, the third doped region 153 is an N-type buried layer (abbreviated as NBL).

The second work area 132 is configured to form at least one diode 192. The second work area 132 has at least one second sub-work area 142. Each second sub-work area 142 includes a fourth doped region 154 of the second conductivity type. The fourth doped region 154 is heavily doped with an N-type dopant and disposed in the substrate 100.

The fourth doped region 154 is electrically connected to the first doped region 151. In an embodiment, the first doped region 151 and the fourth doped region 154 are electrically connected to a positive electrode, and the substrate 100 is electrically connected to a negative electrode.

The first isolation structure 161 is disposed in the substrate 100 and located between the first sub-work areas 141. In an embodiment, the first isolation structure 161 can be a P-type barrier layer (abbreviated as PBL). In another embodiment, the first isolation structure 161 can be realized by a local oxidation of silicon (abbreviated as LOCOS) technique or a shallow trench isolation (abbreviated as STI) technique.

The first work area 131 can be divided in to N first sub-work areas 141 (N can be an integer of 2 or more) by at least one first isolation structure 161, so as to reduce the parasitic capacitance of the electrostatic discharge protection device 10. Specifically, in the first work area 131 of the electrostatic discharge protection device 10, the width of the first doped layer 151 is reduced by interposing the first isolation structure 161 having a width of 0.5 μm to 5 μm therein. Therefore, the PN junction area between the first doped layer 151 and the second doped layer 152 is reduced, and the junction capacitance of the diode string 191 is accordingly decreased. The junction capacitance of the first work area is accordingly reduced. The first work area 131 can be divided evenly into the first sub-work areas 141 having substantially the same width. Alternatively, the first work area 131 can be divided unevenly into the first sub-work areas 141 having different widths.

Referring to FIG. 1A and FIG. 1B, the face-to-face connected diode string 191 includes a forward biased diode and a Zener diode face-to-face connected to each other. The forward biased diode of the diode string 191 has a PN structure constituted by the P-type first doped region 151 and the N-type second doped region 152. The Zener diode of the diode string 191 has an NP structure constituted by the N-type third doped region 153 and the P-type substrate 100.

The doping concentration of the third doped region 153 is higher than the doping concentration of the second doped region 152. If the electrostatic discharge protection device 10 is provided without a third doped region 153 and the second doped region 152 in the first work sub-area 141 is lightly doped, the breakdown voltage of the PN junction between the second doped region 152 and the substrate 100 is high. In the present invention, the electrostatic discharge protection device 10 has a third doped region 153 heavily doped with an N-type dopant, and such third doped region 153 can be configured to adjust the breakdown voltage of the Zener diode.

Still referring to FIG. 1A and FIG. 1B, the at least one diode 192 is constituted by the N-type fourth doped region 154 and the P-type substrate 100.

The electrostatic discharge protection device 10 further includes a plurality of second isolation structures 162 of the first conductivity type. The second isolation structures 162 are disposed between and outside of the first work area 131 and the second work area 132, and configured to isolate the first work area 131 from the second work area 132 and isolate the electrostatic discharge protection device 10 from other layout regions. The structure and forming method of the second isolation structures 162 are similar those of the first isolation structure 161.

In an embodiment, during the normal operation, the working current flows from the negative electrode to the positive electrode of the electrostatic discharge protection device 10 through the diode 192 in the second work area 132. When the electrostatic discharge current is input from the positive electrode in the first module 110 and grounded on the negative electrode of the second module 120, the electrostatic discharge current flows from the positive electrode through the first doped region 151, the second doped region 152 and the third doped region 153, breakdowns the Zener diode and flows into the negative electrode. In this case, the electrostatic discharge protection device 10 is a single-channel single-direction TVS with low capacitance.

Figure 2A:
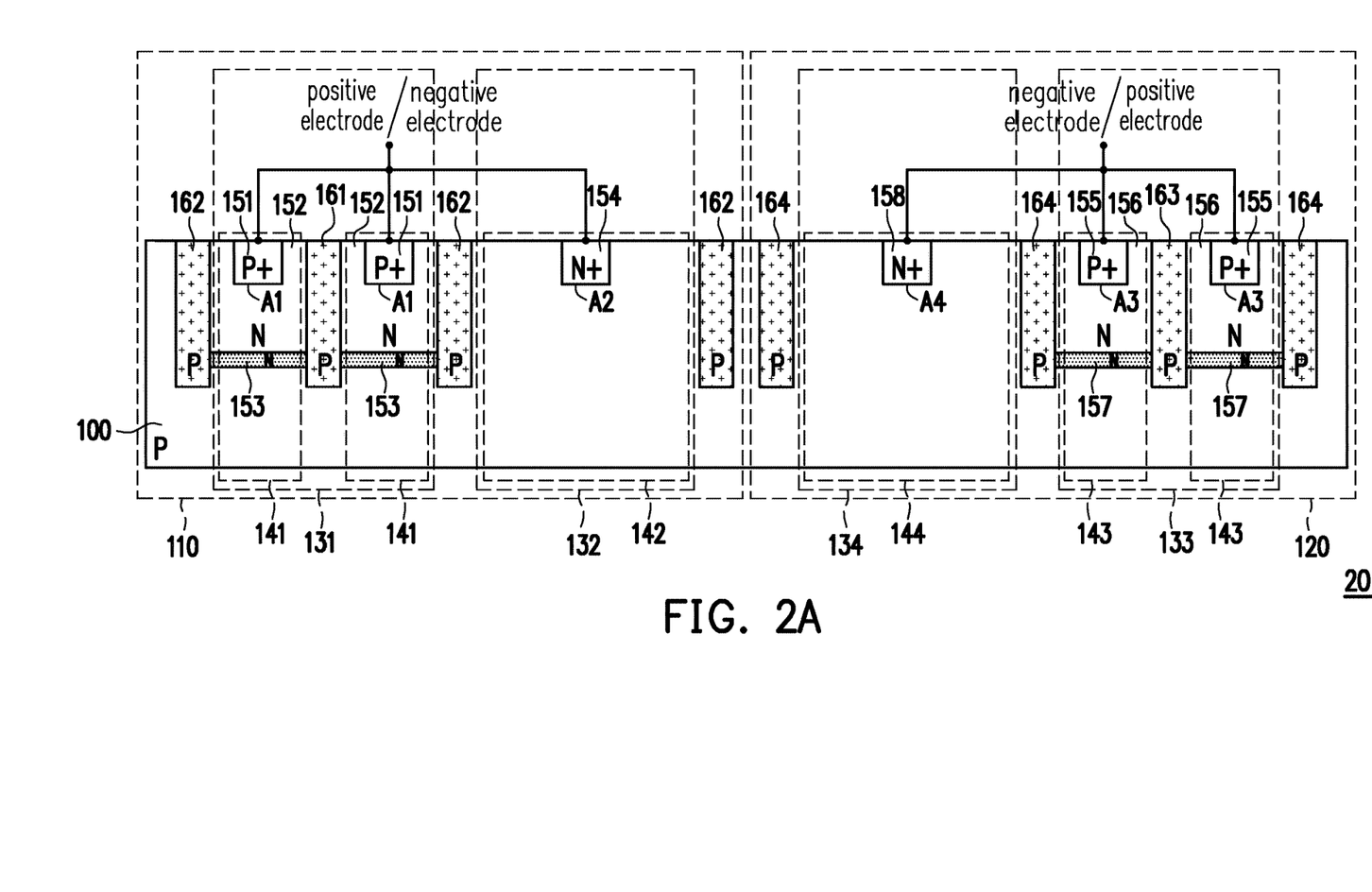
FIG. 2A illustrates a schematic cross-sectional view of an electrostatic discharge protection device according to another embodiment of the present invention.
Figure 2B:
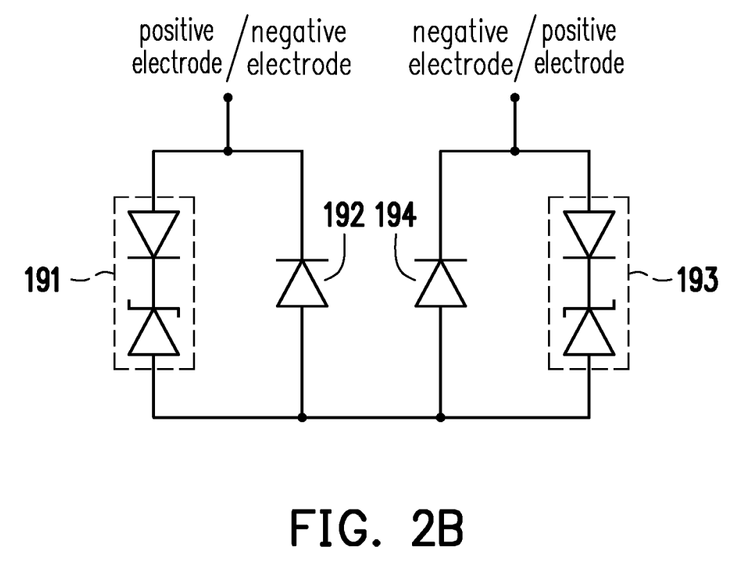
FIG. 2B illustrates an equivalent circuit diagram of an electrostatic discharge protection device according to another embodiment of the present invention.

FIG. 2A illustrates a schematic cross-sectional view of an electrostatic discharge protection device according to another embodiment of the present invention. FIG. 2B illustrates an equivalent circuit diagram of an electrostatic discharge protection device according to another embodiment of the present invention.

Referring to FIG. 2A, the electrostatic discharge protection device 20 has a first module 110 and a second module 120. Except the electrode connection and current flowing direction (described later), the first module 110 has a structure and function similar to those described above and the details are not iterated herein. The second module 120 includes a third work area 133, a fourth work area 134 and a third isolation structure 163 of the first conductivity type. In an embodiment, the second work area 132 and the fourth work area 134 are located between the first work area 131 and the third work area 133. Referring to FIG. 2B, in an equivalent circuit, the electrostatic discharge protection device 20 includes two face-to-face connected diode strings 191 and 193, at least one diode 192 and at least one diode 194. The diode string 191 and the diode 192 have been described above, and the details are not iterated herein. The diode string 193 and the diode 194 will be described later.

The third work area 133 is configured to form a face-to-face connected diode string 193. The third work area 133 has a plurality of third sub-work areas 143. Each of the third sub-work areas 143 includes a fifth doped region 155 of the first conductivity type, a sixth doped region 156 of the second conductivity type and a seventh doped region 157 of the second conductivity type. The fifth doped region 155 is heavily doped with a P-type dopant and disposed in the substrate 100. The sixth doped region 156 is doped with an N-type dopant (labelled as N or N−) and disposed in the substrate 100 and surrounds the fifth doped region 155. The seventh doped region 157 is disposed in the substrate 100 and located below the sixth doped region 156.

The fourth work area 134 is configured to form at least one diode 194. The fourth work area has at least one fourth sub-work area 144. The at least one fourth sub-work area 144 includes an eighth doped region 158 of the second conductivity type. The eighth doped region 158 is heavily doped with an N-type dopant and disposed in the substrate 100.

Besides, the eighth doped region 158 is electrically connected to the fifth doped region 155. In an embodiment, the first doped region 151 and the fourth doped region 154 are electrically connected to a positive electrode, and the fifth doped region 155 and the eighth doped region 158 are electrically connected to a negative electrode. Since the electrostatic discharge protection device 20 has a symmetric structure, the positive and negative electrodes can be exchanged. In another embodiment, the first doped region 151 and the fourth doped region 154 are electrically connected to a negative electrode, and the fifth doped region 155 and the eighth doped region 158 are electrically connected to a positive electrode. The below embodiment in which the first doped region 151 and the fourth doped region 154 are electrically connected to a positive electrode and the fifth doped region 155 and the eighth doped region 158 are electrically connected to a negative electrode is provided for illustration purposes, and is not construed as limiting the present invention.

The third isolation structure 163 is disposed in the substrate 100 and located between the third sub-work areas 143. The structure and forming method of the third isolation structure 163 are similar to those of the first isolation structure 161.

Referring to FIG. 2A and FIG. 2B, a face-to-face connected diode string 193 includes a forward biased diode and a Zener diode face-to-face connected to each other. The forward biased diode of the diode string 191 has a PN structure constituted by the P-type fifth doped region 155 and the N-type sixth doped region 156. The Zener diode of the diode string 191 has an NP structure constituted by the N-type seventh doped region 157 and the P-type substrate 100. The doping concentration of the seventh doped region 157 is higher than the doping concentration of the sixth doped region 156.

Still referring to FIG. 2A and FIG. 2B, the at least one diode 194 is constituted by the N-type eighth doped region 158 and the P-type substrate 100.

The electrostatic discharge protection device 20 further includes a plurality of fourth isolation structures 164 of the first conductivity type. The fourth isolation structures 164 are disposed between and outside of the work area 133 and the fourth work area 134 and configured to isolate the third work area 131 from the fourth work area 134. The fourth isolation structures 164 are also configured to isolate the first module 110 from the second module 120 and isolate the electrostatic discharge protection device 20 from other layout regions. The structure and forming method of the fourth isolation structure 164 are similar to those of the second isolation structures 162.

In the electrostatic discharge protection device 20, the first work area 131 in the first module 110 is divided into N first sub-work areas 141 by the first isolation structure 161, and the third work area 133 in the second module 120 is divided into N third sub-work areas 143 by the third isolation structure 163, so as to reduce the parasitic capacitance of the electrostatic discharge protection device 20.

In an embodiment, when the electrostatic discharge pulse is input from the positive electrode in the first module 110 and grounded on the negative electrode of the second module 120, the electrostatic discharge current flows from the positive electrode of the first module 110 through the first doped region 151, the second doped region 152 and the third doped region 153 in the first work area 131, through the substrate 100 and through the seventh doped region 157, the sixth doped region 156 and the fifth doped region 155 in the third work area 133, and is finally grounded on the negative electrode of the second module 120. On the contrary, when the electrostatic discharge pulse is input of the positive electrode in the second module 120 and grounded on the negative electrode of the first module 110, the electrostatic discharge current flows from the positive electrode of the second module 120 through the fifth doped region 155, the sixth doped region 156 and the seventh doped region 157 in the third work area 133, through the substrate 100 and through the third doped region 153, the second doped region 152 and the first doped region 151 in the first work area 131, and is finally grounded on the negative electrode of the first module 110. In such case, the electrostatic discharge protection device 20 is a single-channel bidirectional TVS with low capacitance.

In an embodiment, the area ratio of the work areas of the electrostatic discharge protection device 20 can be further adjusted to improve the electrostatic discharge protection capability. Referring to FIG. 2A, in the first work area 131, the junction area between the first doped region 151 and the second doped region 152 is A1. In the second work area 132, the junction area between the fourth doped region 154 and the substrate 100 is A2. In the third work area 133, the junction area between the fifth doped region 155 and the sixth doped region 156 is A3. In the fourth work area 134, the junction area between the eighth doped region 158 and the substrate 100 is A4. In an embodiment, the ratio of A1/A4 is set as less than or equal to about ½, and the ratio of A3/A2 is set as less than or equal to about ½. In an embodiment, the ratio of A1/A4 is set as between about ½ and about ⅒, and the ratio of A3/A2 is set as between about ½ and about ⅒. For example, the ratio of A1/A4 or A3/A2 is about ½, ⅓, ¼, ⅕, ⅙, ⅐, ⅛, ⅑ or ⅒, including any range of any two of the preceding values.

Figure 3:
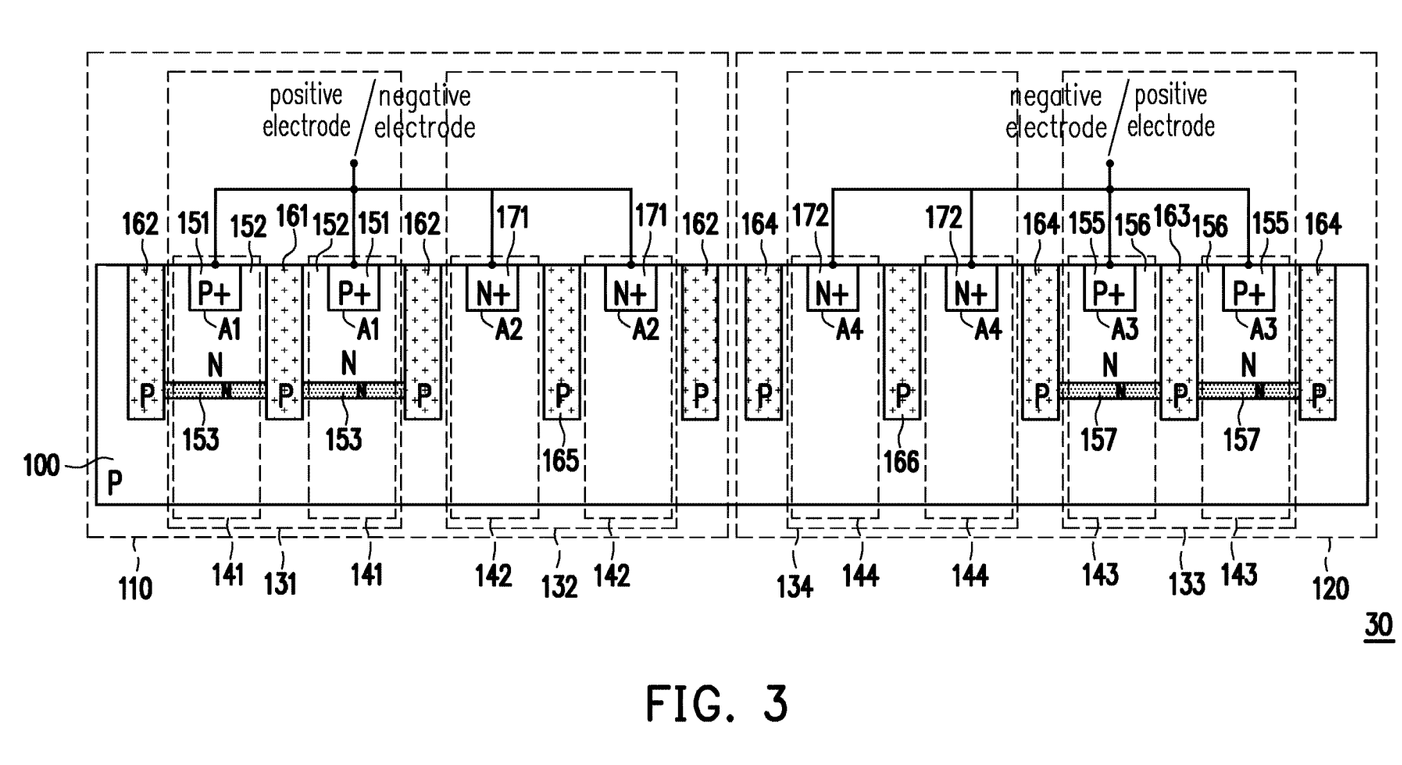
FIG. 3 illustrates a schematic cross-sectional view of an electrostatic discharge protection device according to yet another embodiment of the present invention.

FIG. 3 illustrates a schematic cross-sectional view of an electrostatic discharge protection device according to yet another embodiment of the present invention. Referring to FIG. 3 and FIG. 2, in the electrostatic discharge protection devices 30 and 20, the first work area 131 and the third work area 133 have similar structures, while the second work area 132 and the fourth work area 134 have different structures. Specifically, in the electrostatic discharge protection device 30 of FIG. 3, the second work area 132 and the fourth work area 134 can be respectively divided to further reduce the parasitic capacitance.

Referring to FIG. 3, the second work area 132 includes a plurality of second sub-work areas 142, and a fifth isolation structure 165 of the first conductivity type is disposed between the second sub-work areas 142. Each of the second sub-work areas 142 includes a twelfth doped region 171 of the second conductivity type. Besides, the fourth work area 134 includes a plurality of fourth sub-work areas 144, and a sixth isolation structure 166 of the first conductivity type is disposed between the fourth sub-work areas 134. Each of the fourth sub-work areas 144 includes a thirteenth doped region 172 of the second conductivity type.

In an embodiment, the diode 192 constitutes the second work area 132. The PN junction capacitance is relatively high without the disposition of the fifth isolation structure 165. The diode of the second work area 132 can be divided into two parts by interposing the fifth isolation structure 165 having an appropriate width of 0.5 μm to 5 μm therein. In fact, the number of the divided parts is an integer greater than 2, and the second work area 132 can be divided evenly or unevenly. Besides, due to the thickness of the fifth isolation structure 165 per se, the junction area of the diode 192 in the second work area 132 can be reduced to further decrease the parasitic capacitance. Similarly, the parasitic capacitance of the fourth work area 134 can be reduced by dividing the fourth work area 134 into multiple parts.

Figure 4:
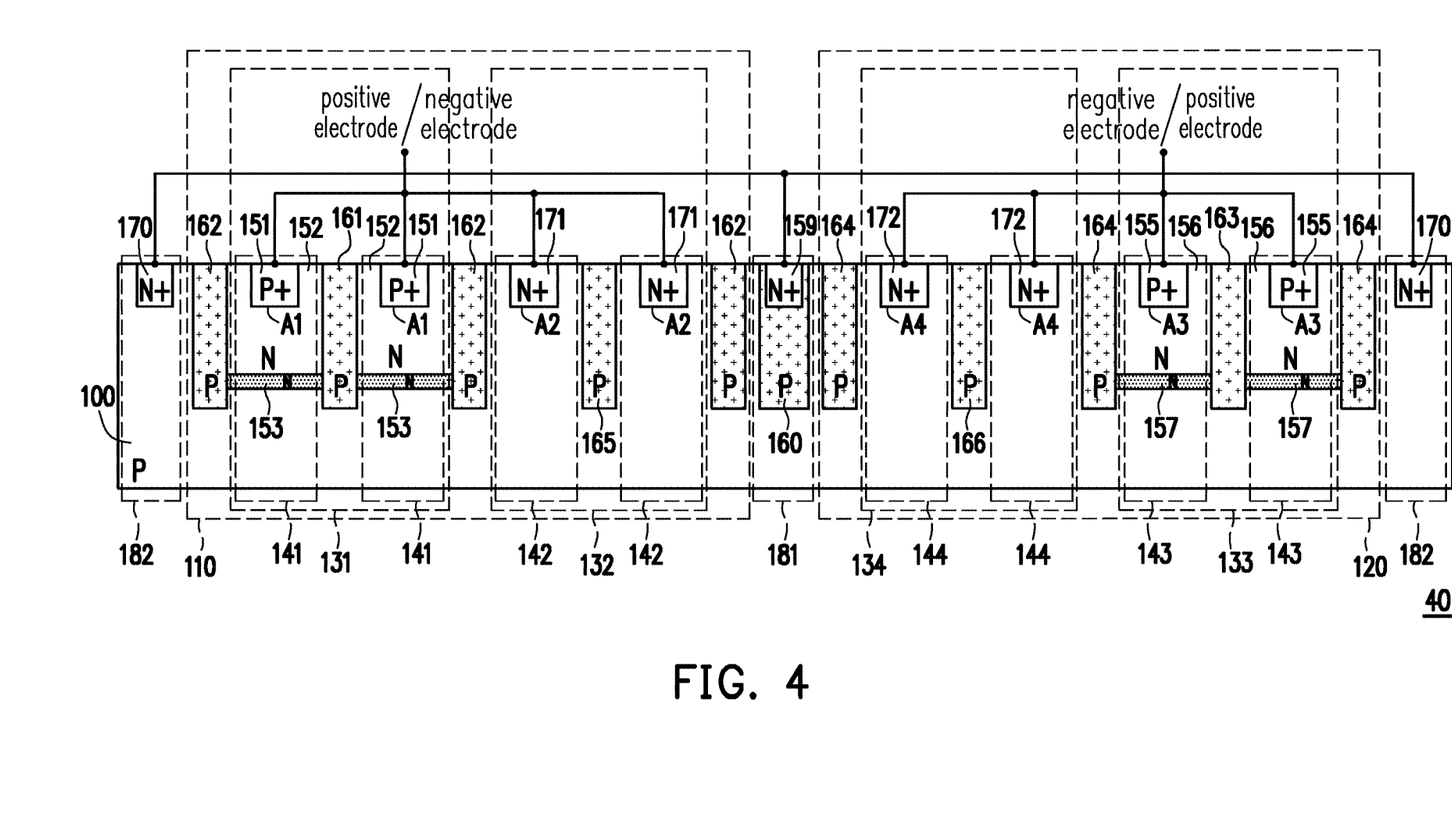
FIG. 4 illustrates a schematic cross-sectional view of an electrostatic discharge protection device according to still another embodiment of the present invention.

FIG. 4 illustrates a schematic cross-sectional view of an electrostatic discharge protection device according to still another embodiment of the present invention. The electrostatic discharge protection device 40 of FIG. 4 is similar to the electrostatic discharge protection device 30 of FIG. 3, and the difference between them lies in that, the electrostatic discharge protection device 40 further includes a first protection structure 181 and a second protection structure 182. The first protection structure 181 and the second protection structure 182 are electrically connected to each other.

The first protection structure 181 is disposed between the first module 110 and the second module 120. The first protection structure 181 includes of a ninth doped region 159 of the second conductivity type and a tenth doped region 160 of the first conductivity type. The ninth doped region 159 is disposed in the substrate 100. The tenth doped region 160 is disposed in the substrate 100 and surrounds the ninth doped region 159.

The second protection structure 182 is disposed outside of the first module 110 and the second module 120. The second protection structure 182 includes an eleventh doped region 170 of the second conductivity type. The eleventh doped region 170 is disposed in the substrate 100.

The first protection structure 181 and the second protection structure 182 are configured to reduce mutual interference and avoid leakage current between the first module 110 and the second module 120.

In summary, the present invention provides a bidirectional transient voltage suppressor with low capacitance characteristics. The parasitic capacitance of the bidirectional transient voltage suppressor can be reduced and the electrostatic discharge protection capability of the same can be enhanced by dividing the work area to reduce the PN junction area, adjusting the area ratio between the divided work areas and/or disposing an isolation protection structure between devices.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An electrostatic discharge protection device, comprising:
   a first module, comprising:
      a first work area, configured to form a face-to-face connected diode string and having a plurality of first sub-work areas, wherein each of the first sub-work areas comprises:
         a first doped region of a first conductivity type, disposed in a substrate of the first conductivity type;
         a second doped region of a second conductivity type, disposed in the substrate and surrounding the first doped region; and
         a third doped region of the second conductivity type, disposed in the substrate and located below the second doped region, wherein a doping concentration of the third doped region is higher than a doping concentration of the second doped region;
      a first isolation structure of the first conductivity type, disposed in the substrate and located between the first sub-work areas; and
      a second work area, configured to form at least one diode and having at least one second sub-work area, wherein the at least one second sub-work area comprises:
         a fourth doped region of the second conductivity type, disposed in the substrate and electrically connected to the first doped region.

2. The electrostatic discharge protection device of claim 1, further comprising:
   a plurality of second isolation structures of the first conductivity type, disposed between and outside of the first work area and the second work area.

3. The electrostatic discharge protection device of claim 1, wherein the first doped region and the fourth doped region are electrically connected to a positive electrode, and the substrate is electrically connected to a negative electrode.

4. The electrostatic discharge protection device of claim 1, further comprising:
   a second module, comprising:
      a third work area, configured to form a face-to-face connected diode string and having a plurality of third sub-work areas, wherein each of the third sub-work areas comprises:
         a fifth doped region of the first conductivity type, disposed in the substrate;
         a sixth doped region of the second conductivity type, disposed in the substrate and surrounding the fifth doped region; and
         a seventh doped region of the second conductivity type, disposed in the substrate and located below the sixth doped region; and
      a third isolation structure of the first conductivity type, disposed in the substrate and located between the third sub-work areas; and
      a fourth work area, configured to form at least one diode and having at least one fourth sub-work area, wherein the at least one fourth sub-work area comprises:
         an eighth doped region of the second conductivity type, disposed in the substrate and electrically connected to the fifth doped region.

5. The electrostatic discharge protection device of claim 4, wherein the first doped region and the fourth doped region electrically connected to a positive electrode, and the fifth doped region and the eighth doped region electrically connected to a negative electrode.

6. The electrostatic discharge protection device of claim 4, wherein the first doped region and the fourth doped region electrically connected to a negative electrode, and the fifth doped region and the eighth doped region electrically connected to a positive electrode.

7. The electrostatic discharge protection device of claim 4, wherein a junction area between the first doped region and the second doped region in the first work area is A1, a junction area between the fourth doped region and the substrate in the second work area is A2, a junction area between the fifth doped region and the sixth doped region in the third work area is A3, a junction area between the eighth doped region and the substrate in the fourth work area is A4, a ratio of A1/A4 is less than or equal to ½, and a ratio of A3/A2 is less than or equal to ½.

8. The electrostatic discharge protection device of claim 7, wherein the ratio of A1/A4 is between ½ and ¹⁄₁₀, and the ratio of A3/A2 is between ½ and ¹⁄₁₀.

9. The electrostatic discharge protection device of claim 4, further comprising:
   a plurality of fourth isolation structures of the first conductivity type, disposed between and outside of the third work area and the fourth work area.

10. The electrostatic discharge protection device of claim 4, wherein the second work area and the fourth work area are located between the first work area and the third work area.

11. The electrostatic discharge protection device of claim 4, wherein the at least one second sub-work area comprises a plurality of second sub-work areas, and a fifth isolation structure of the first conductivity type is disposed between the second sub-work areas.

12. The electrostatic discharge protection device of claim 11, wherein the at least one fourth sub-work area comprises a plurality of fourth sub-work areas, and a sixth isolation structure of the first conductivity type is disposed between the fourth sub-work areas.

13. The electrostatic discharge protection device of claim 12, further comprising:
- a first protection structure, disposed between the first module and the second module and comprising:
  - a ninth doped region of the second conductivity type, disposed in the substrate; and
  - a tenth doped region of the first conductivity type, disposed in the substrate and surrounding the ninth doped region.

14. The electrostatic discharge protection device of claim 13, further comprising:
- a second protection structure, disposed outside of the first module and the second module and comprising:
  - an eleventh doped region of the second conductivity type, disposed in the substrate.

15. The electrostatic discharge protection device of claim 14, wherein the first protection structure and the second protection structure are electrically connected to each other.

* * * * *